(12) United States Patent
Yen et al.

(10) Patent No.: US 6,972,366 B2
(45) Date of Patent: ***Dec. 6, 2005

(54) MULTILAYER STRUCTURE FOR ABSORBING ELECTROMAGNETIC WAVE AND MANUFACTURING METHOD THEREOF

(76) Inventors: Li-Hsien Yen, 5Fl., No. 8, Alley 9, Lane 81, Yungye Rd., Shindian City, Taipei County (TW) 231; Garrett Lin, 3Fl., No. 346, Sec. 2, Jincheng Rd., Tucheng City, Taipei County (TW) 236

( * ) Notice: Subject to any disclaimer, the term of this patent is extended or adjusted under 35 U.S.C. 154(b) by 0 days.

This patent is subject to a terminal disclaimer.

(21) Appl. No.: 10/604,393

(22) Filed: Jul. 17, 2003

(65) Prior Publication Data

US 2004/0234750 A1 Nov. 25, 2004

(30) Foreign Application Priority Data

May 19, 2003 (TW) ................................ 92113431 A

(51) Int. Cl.⁷ ............................................... H05K 9/00
(52) U.S. Cl. ............................. 174/35 R; 174/35 MS
(58) Field of Search ............................ 174/35 R, 35 MS

(56) References Cited

U.S. PATENT DOCUMENTS

| 4,973,514 | A | * | 11/1990 | Gamble et al. | .......... 428/297.4 |
| 5,455,117 | A | * | 10/1995 | Nagano et al. | ............. 428/545 |
| 5,554,678 | A | * | 9/1996 | Katsumata et al. | ......... 524/495 |
| 5,938,979 | A | * | 8/1999 | Kambe et al. | ............... 252/100 |
| 6,410,847 | B1 | * | 6/2002 | Allen et al. | ............. 174/35 MS |
| 6,570,085 | B1 | * | 5/2003 | Gabower | ............... 174/35 MS |

* cited by examiner

*Primary Examiner*—Cathy F. Lam
(74) *Attorney, Agent, or Firm*—Jiano Chyun IP Office

(57) ABSTRACT

A film structure for absorbing electromagnetic wave and manufacturing method thereof is provided. The multilayer film structure is composed of a plurality of polymer films and a plurality of permeability films. The polymer films have a multi-film stacking structure and the polymer films are composed of a carbon group compound structure. The permeability films are formed on each surface of the polymer films. Thus, every neighboring permeability films will have magnetic moments in opposite direction, and all the emitted electromagnetic waves will be cancelled by the permeability films, or be reflected in any one of the polymer films until the energies of the electromagnetic waves are consumed, or be absorbed by the carbon group compound structure and be transferred into thermal energy.

7 Claims, 4 Drawing Sheets

MULTILAYER STRUCTURE FOR ABSORBING ELECTROMAGNETIC WAVE AND MANUFACTURING METHOD THEREOF

CROSS REFERENCE TO RELATED APPLICATIONS

This application claims the priority benefit of Taiwan application serial no. 92113431, filed May 19, 2003.

BACKGROUND OF INVENTION

1. Field of the Invention

The present invention relates to a film structure for absorbing electromagnetic wave and manufacturing method thereof. More particularly, the present invention relates to a multilayer structure having high absorbing efficiency for electromagnetic wave and manufacturing method thereof.

2. Description of the Related Art

In recent years, as the trends of the computer, commercial and consuming electronic devices are towards portable, wireless and high frequency, the amount of the electromagnetic waves emitted and leaked from these electronic devices are increased rapidly. According to a lot of results of researches, the organizations and functions of the cells of a human body may be damaged by a large amount of high frequency electromagnetic wave, and a lot of diseases, such as leukemia, brain tumor and deoxyribonucleic acid (DNA) destruction may be caused. According to some results of researches, when a human body is explored to an specific electromagnetic wave, such as that from a mobile phone, for a long time period, the functions of a main brain may be effected, such as loosing memory temporary, loosing capacity and bradykinesia. As the wireless and high frequency electronic devices are getting more popularly, anti-electromagnetic wave material, structure and device suitable for these electronic devices are more and more important.

In general, there are at least two kinds of anti-electromagnetic wave structures are developed, one is an electric field screening material, such as metal, electric conductive polymers, electric conductive films, electric conductive complex materials having plastics and rubbers, electric conductive adhesive and electric conductive surface treatment. The other one is a magnetic field screening material, such as magnetic material, magnetic complex material and superconductor. Moreover, a material obtained from blending a metal fiber with other fibers may be used as an anti-electromagnetic wave material or cloth. More particularly, an anti-electromagnetic wave surface of some materials can also be obtained by coating a non-toxic material using an organic nanolevel complex material with a polymer coated cloth manufacturing process on a surface of a material including metal, alloy, wood, ceramic and so on.

However, in the conventional anti-electromagnetic wave material, structure or device, the thickness of that is too thick to be used for a portable, thin-and-light electronic device such as a mobile phone. Moreover, there is still some leakage of the electromagnetic wave from the electronic devices covered or coated with the conventional anti-electromagnetic wave material, structure or device.

SUMMARY OF INVENTION

Accordingly, one object of the present invention is to provide a film structure for absorbing electromagnetic wave and manufacturing method thereof, in which the structure and the method can be provided for a thin-and-light electronic device.

Another object of the present invention is to provide a film structure for absorbing electromagnetic wave and manufacturing method thereof, in which the structure and the method can be provided for absorbing electromagnetic wave and transforming the electromagnetic wave into thermal energy.

To achieve these and other advantages and in accordance with the purpose of the invention, as embodied and broadly described herein, a multilayer film structure for absorbing electromagnetic wave is provided. The multilayer film structure is composed of a plurality of polymer films and a plurality of permeability films. The polymer films have a multi-film stacking structure and the polymer films are composed of a carbon group compound structure. The permeability films are formed on each surface of the polymer films.

In the first embodiment of the invention, the carbon group compound structure is a nanolevel silicon carbide particle.

Another object of the present invention is to provide a manufacturing method of a multilayer film structure for absorbing electromagnetic wave. The manufacturing method includes providing a polymer solution and adding a carbon group compound structure into the polymer solution. Then forming a plurality of polymer films by using the polymer solution. After forming a plurality of permeability films on each surface of the polymer films, then stacking the polymer films to obtain a multilayer film structure.

In the first embodiment of the invention, the step of forming a plurality of permeability films on each surface of the polymer films comprises a step of using a vacuum sputtering method.

Another object of the present invention is to provide a manufacturing method of an anti-electromagnetic wave device. The manufacturing method includes the steps of: (a) providing a main body having a cover; (b) forming a polymer film on an inner side of the cover, wherein the polymer films comprising a carbon group compound structure; (c) forming a permeability film on a surface of the polymer film; and (d) repeating the steps (b) and (c).

Accordingly, because of the film structure of the present invention is composed of multilayer of polymer films, and the surface of the polymer film is plated with permeability film, the emitted electromagnetic wave will be cancelled by the permeability film. Therefore, the electromagnetic wave in the multilayer polymer films will proceed to refract inside the films, and then the energy of the electromagnetic wave will be totally absorbed finally. In another case, the energy of the electromagnetic wave in the multilayer polymer films will be absorbed by the carbon group compound structure and transferred into thermal energy. Moreover, the thickness of the film structure of the present invention can be optimized according to the application on a thin-and-light electronic device.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

First Embodiment

Figure 1:
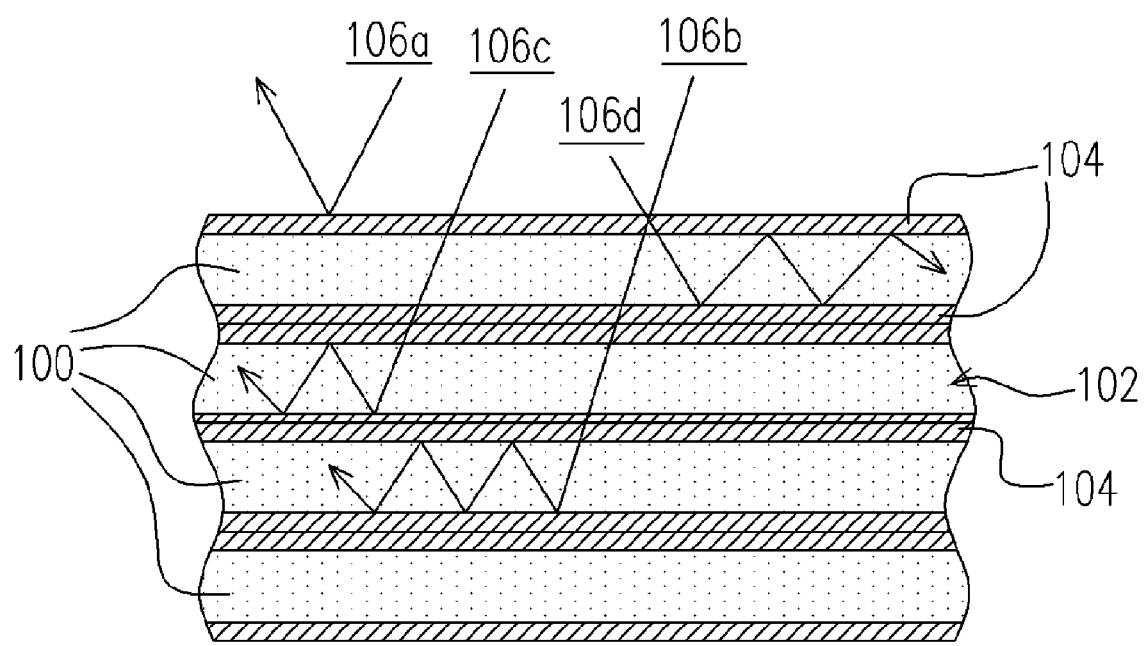
FIG. 1 is a cross-sectional view of the multilayer film structure for absorbing electromagnetic wave of a first embodiment of the invention.

FIG. 1 is a cross-sectional view of the multilayer film structure for absorbing electromagnetic wave of a first embodiment of the invention.

Referring to FIG. 1, a multilayer film structure for absorbing electromagnetic wave of the invention including a plurality of polymer films 100 and a plurality of permeability films 104. The material of polymer films 100 includes, but not limited to, polyethylene or another polymers. The polymer films 100 have a multi-film stacking structure and at least one of the polymer films 100 is composed of a carbon group compound structure 102. The carbon group compound structure 102 includes, for example but not limited to, a carbon fiber or a carbon containing particle, and the carbon containing particle includes a silicon carbide particle or a nanolevel particle. The permeability films 104 are formed on each surface of the polymer films 100. Therefore, when electromagnetic waves 106a, 106b, 106c and 106d are emitted, the direction of induced magnetic moment of a permeability film 104 above a polymer film 100 is opposite to that of another permeability film 104 below the same polymer film 100. Thus, every neighboring permeability films 104 will have magnetic moments in opposite direction. Finally, except for the reflected electromagnetic wave 106a, all the other emitted electromagnetic waves will be cancelled by the permeability films 104, or be reflected in any one of the polymer films 100 until the energies of the electromagnetic waves are consumed, or be absorbed by the carbon group compound structure 102 and be transferred into thermal energy.

Referring to FIG. 1 again, far-infrared ceramic may also be added into the polymer films 100 for absorbing the electromagnetic wave and transferring it into a far-infrared radiation. Preferably, the permeability films 104 include, for example but not limited to, a metal film, and a thickness of the metal film is in a range of 10 $\mu$m to 100 $\mu$m, in which the metal film may be composed of an alloy film or a stacking layer composed of at least one layer of the group consisted of aluminum layer, nickel layer, iron layer, copper layer or cobalt layer. When the permeability films 104 is composed of an alloy film, materials of the alloy may be at least one of the group consisted of aluminum, nickel, iron, copper, cobalt, and a trace of manganese may be added into the alloy film.

Figure 2:
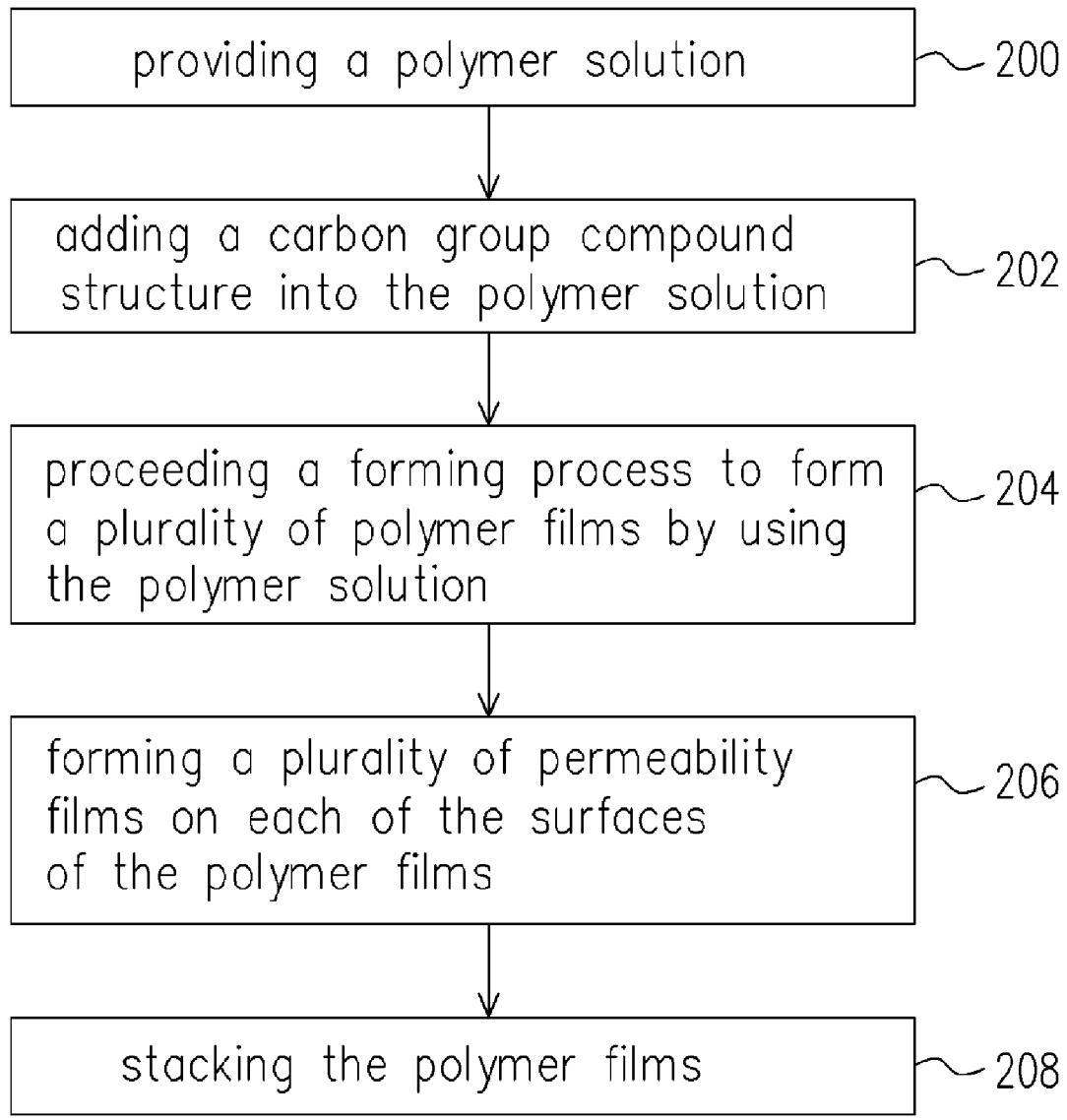
FIG. 2 is a process flow of manufacturing steps of the multilayer film structure for absorbing electromagnetic wave of the first embodiment of the invention.

FIG. 2 is a process flow of manufacturing steps of the multilayer film structure for absorbing electromagnetic wave of the first embodiment of the invention.

Referring to FIG. 2, providing a polymer solution in the step 200, adding a carbon group compound structure into the polymer solution in the step 202. Then forming a plurality of polymer films by using the polymer solution in the step 204. Thereafter, forming a plurality of permeability films on each surface of the polymer films in the step 206. Here, a method of forming a plurality of permeability films includes, but not limited to, a vacuum sputtering or an electroplating method. Proceeding a depositing process on each surface of the polymer films for several times in order to form a multilayer metal film may also be used as permeability films. Finally, stacking the polymer films in the step 208 by a gluing or heat pressing method. Moreover, the step 202 may further includes a step of adding a far-infrared ceramic into the polymer film solution.

Second Embodiment

Figure 3:
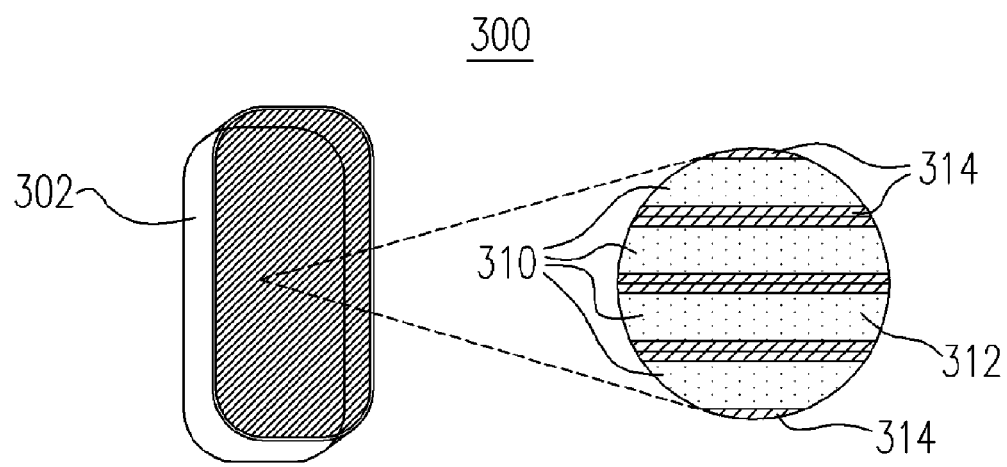
FIG. 3 is a sketch illustrating an anti-electromagnetic wave device of a second embodiment of the present invention.

FIG. 3 is a sketch illustrating an anti-electromagnetic wave device of a second embodiment of the present invention.

Referring to FIG. 3, the anti-electromagnetic wave device of the invention is applicable for absorbing the electromagnetic wave emitted from the main body 300 having a cover 302. The feature of the embodiment is that a plurality of polymer films 310 having a multi-film stacking structure are attached to an inner side of the cover 302. The polymer films 310 are composed of a carbon group compound structure 312, and a plurality of permeability films 314 are formed on each surface of the polymer films 310. Moreover, the materials and characteristics are the same as that of the multilayer film structure for absorbing electromagnetic wave described in the first embodiment. However, the cover of the main body will be changed when the present invention is provided for various fields of applications. Therefore, the cover of the main body of the present invention is changed corresponding to the shape attached thereon and the layer number and the thickness of the polymer films 310 are dependent on the strength of the electromagnetic wave.

Figure 4:
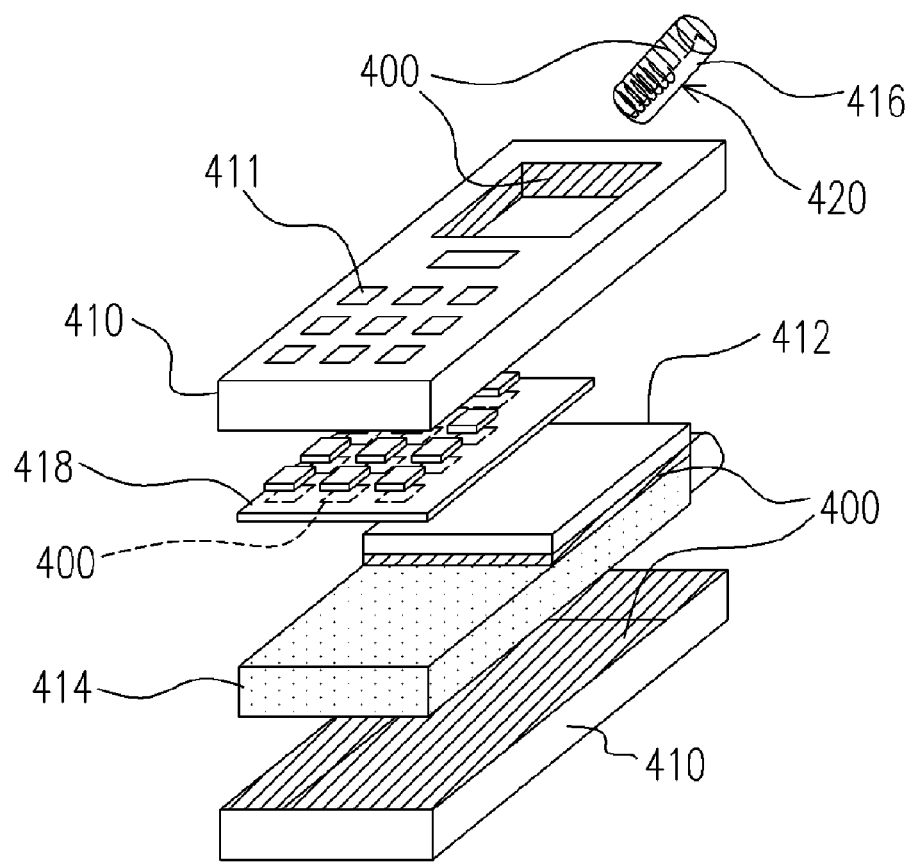
FIG. 4 is a fragmental view illustrating an application of an anti-electromagnetic wave structure on a mobile phone of a second embodiment of the present invention.

FIG. 4 is a fragmental view illustrating an application of an anti-electromagnetic wave device on a mobile phone of a second embodiment of the present invention.

Referring to FIG. 4, a general mobile phone as shown includes a top cover and bottom cover 410, a screen 412, a main board 414, an antenna 416 and a keypad 418. In order to introduce the anti-electromagnetic wave effect into the mobile phone, the multilayer film structure 400 may be disposed on the surfaces of the inner side of the top cover and the bottom cover 410, and the common surface between the screen 412 and the main board 414. Moreover, to prevent leakage of the electromagnetic wave from the keypad 418, the multilayer film structure 400 may be disposed on the common surface between the keypad 418 and the main board 414, in order to cover the whole surfaces of the main board 414. Here, the keypad 418 is mounted between the main board 414 and the inner side of the top cover 410, and the keys on the keypad 418 is mounted in the openings 411 of the top cover 410. In addition, the multilayer film structure 400 may be disposed on the surface of the inner side of the top cover 410 near the antenna 416, and a part 420 of the antenna 416 can not be disposed by the multilayer film structure 400 to transmit and receive the electromagnetic waves. In practice, the layer number of the multilayer film structure 400 used in the mobile phone described above is at least 4 layer to prevent the leakage of the electromagnetic wave, and the total thickness of the multilayer film structure 400 is in a range of, but not limited to, about 0.1 mm to about 0.2 mm. However, the example described in the embodiment shown in FIG. 4 is used for describing one of the applications of the present invention, and the multilayer film structure may be used to various of the electronic parts and devices for anti-electromagnetic wave.

Figure 5:
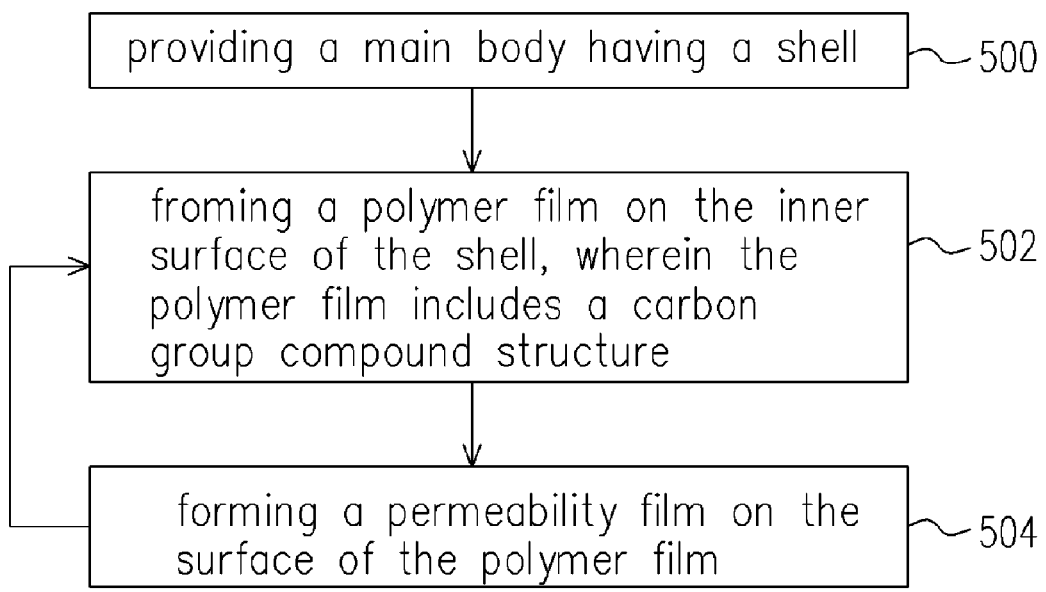
FIG. 5 is a process flow of manufacturing steps of an anti-electromagnetic wave device of the first embodiment of the invention.

FIG. 5 is a process flow of manufacturing steps of an anti-electromagnetic wave device of the first embodiment of the invention.

Referring to FIG. 5, providing a main body having a cover in the step 500. Then forming a polymer film on an inner side of the cover in the step 504, in which the polymer films comprising a carbon group compound structure, and a far-infrared ceramic may be added into the polymer before the polymer films are formed in order to transfer electromagnetic wave into far-infrared radiation. Therefore, forming a permeability film on a surface of the polymer film in the step 504, in which a method of forming the permeability films includes, but not limited to, a vacuum sputtering or an electroplating method for forming an alloy layer on the surface of the polymer film. Proceeding a depositing process on each surface of the polymer films for several times to form a multilayer metal film may also be used as permeability films. Finally repeating the steps 502 and 504 to form an anti-electromagnetic wave device using the multilayer film structure.

Accordingly, because of the film structure of the present invention is composed of multilayer of polymer films, and the surface of the polymer film is plated with permeability film, the emitted electromagnetic wave will be cancelled by the permeability film. Therefore, the electromagnetic wave in the multilayer polymer films will proceed to refract inside the films, and then the energy of the electromagnetic wave will be totally absorbed finally. In another case, the energy of the electromagnetic wave in the multilayer polymer films will be absorbed by the carbon group compound structure and transferred into thermal energy. Moreover, the thickness of the film structure of the present invention can be optimized according to the application on a thin-and-light electronic device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multilayer film structure for absorbing electromagnetic wave, comprising:
   a plurality of polymer films having a multi-film stacking structure, wherein the polymer films are composed of a carbon group compound structure, wherein the carbon group compound structure comprises a carbon containing particle, wherein the carbon containing particle comprises a silicon carbide particle; and
   a plurality of permeability films formed on each surface of the polymer films.

2. The multilayer film structure of claim 1, wherein the permeability films comprise a metal film.

3. The multilayer film structure of claim 2, wherein a thickness of the metal film is in a range of 10 $\mu$m to 100 $\mu$m.

4. The multilayer film structure of claim 2, wherein the metal film comprises an alloy film.

5. The multilayer film structure of claim 2, wherein the metal film is a stacking layer composed of at least one layer in the group consisted of aluminum layer, nickel layer, iron layer, copper layer and cobalt layer.

6. The multilayer film structure of claim 1, wherein the carbon containing particle comprises a nanoparticle.

7. The multilayer film structure of claim 1, wherein the polymer films comprise a film having a far-infrared ceramic.

* * * * *